United States Patent [19]

Yevick

[11] 4,041,114

[45] Aug. 9, 1977

[54] INDENT DUPLICATING PROCESS

[75] Inventor: George Johannus Yevick, Leonia, N.J.

[73] Assignee: Personal Communications, Inc., Stamford, Conn.

[21] Appl. No.: 592,723

[22] Filed: July 3, 1975

[51] Int. Cl.² ............................................. B29D 11/00
[52] U.S. Cl. ........................................ 264/1; 264/219;
264/220; 96/81; 353/120; 354/115; 355/54
[58] Field of Search ........................... 96/35, 27 R, 81;
353/25, 26, 27, 38, 120, 122; 354/102, 115;
355/46, 54; 264/1, 219, 220

[56] References Cited

U.S. PATENT DOCUMENTS

| | | | |
|---|---|---|---|
| 3,758,649 | 9/1973 | Frattarola | 264/220 |
| 3,840,417 | 10/1974 | Yager | 264/1 X |
| 3,853,395 | 12/1974 | Yevick | 353/38 |
| 3,864,034 | 2/1975 | Yevick | 353/120 |
| 3,882,207 | 5/1975 | Hannan et al. | 264/1 |

OTHER PUBLICATIONS

Bartolini et al., "Replication of Relief-Phase Holograms for Prerecorded Video", J. of Electrochem. Soc., Oct. 1973, pp. 1408–1413.

*Primary Examiner*—Edward C. Kimlin
*Attorney, Agent, or Firm*—Thomas J. Greer, Jr.

[57] ABSTRACT

A method of making copies of information sets of the type carried by microfiche elements having integral lenses on one surface thereof. The microfiche copy is made by embossing the top surface of a plastic, planar blank to form the integral lenses. The bottom surface of the blank is selectively dimpled by a stamping block, the dimples having the shape of generally hemi-spherical cavities. The dimples function in a manner analogous to developed images in a photographic emulsion. The dimples scatter light normally incident upon the bottom surface of the microfiche and thus function as light absorbers vis a vis an image viewed on a projection screen. Thus, microfiche copies may be made without the use of silver bromide. The selective rupture process may also be employed in the duplication of motion picture film.

3 Claims, 7 Drawing Figures

INDENT DUPLICATING PROCESS

This invention relates to a method of making microfiche elements, particularly in mass production thereof and is an improvement on the invention described in my co-pending U.S. patent application entitled "Punch Duplicating Process," filed June 3, 1975, Ser. No. 583,210, hereby incorporated by reference. In that patent application, a method is described for cheaply making copies of an original microfiche. The microfiche is of the type shown in my U.S. Pat. No. 3,864,034. My U.S. Pat. Nos. 3,865,485 and 3,824,609 also describe such microfiche elements. According to that patent application cheap, mass-produced microfiche copies are made by selectively punching through an opaque coating on the bottom surface of a lensfiche. The punching is done by spikes integral with one surface of a stamping block. The stamping block may be made, for example, by a photoresist process in accordance with techniques known in the photoresist and microcircuitry etching arts. The size of the punched openings in the opaque coating correspond with the original images copied, the transmission of light through the punched openings defining the copied image on a suitable viewing screen. By such technique, copies may be fashioned without the use of silver bromide and without the usual dark room, developing chemicals, and the like.

According to the practice of the present invention, the opaque film on the bottom surface of the lensfiche is no longer required. Instead of an apertured, opaque film controlling the transmission of projecting illumination through the lensfiche for final viewing on a viewing screen, the bottom surface is selectively dimpled. When projecting illumination now strikes the bottom surface of the lensfiche, the major portion thereof is refracted away from the normal at those lensfiche regions immediately above each dimple by the indented, hemi-spherical surfaces of the dimples. The stamping block carries hemispherical nodules as integral portions of one surface thereof.

IN THE DRAWNGS

Figure 6:
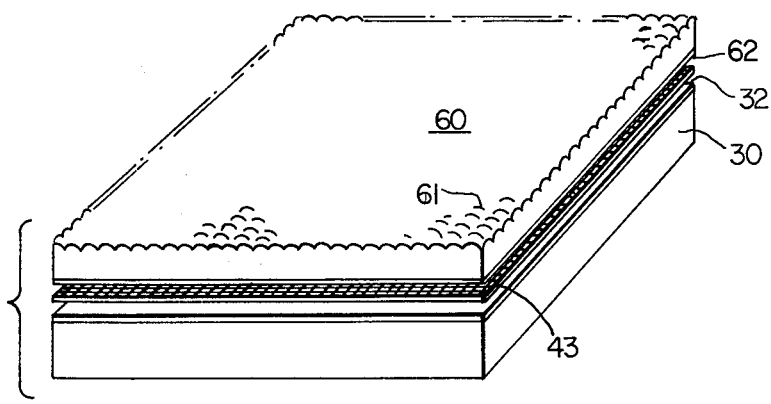
Figure 7:
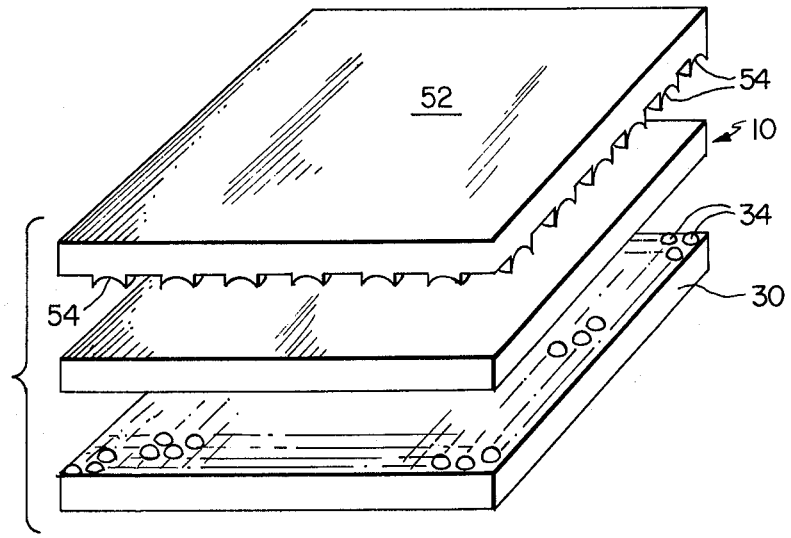

FIG. 6 is a partially schematic view indicating another method of forming a relief or master photoresist block FIG. 7 is a partially schematic view illustrating one method for the simultaneous formation of lens elements on a microfiche and the recording of optical information thereon to thereby insure a maximum of accurate registry between the lenses on one surface of the microfiche and the information on the other surface.

Figure 2:
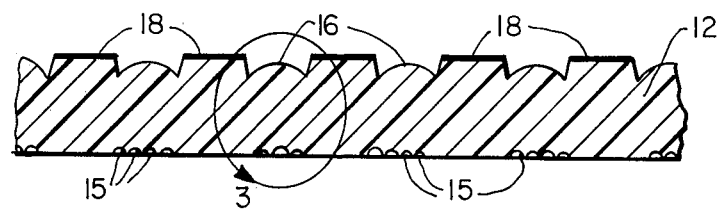
FIG. 2 is a partial cross-section view of a complete microfiche.

Referring now to the drawings, the numeral 10 denotes generally a typical virgin blank or substrate in the general form of a planar member from which microfiche elements are to be fabricated. The numeral 12 denotes the main portion of the substrate 10 and consists of a thermoplastic material such as polycarbonate. The numeral 14 denotes the plain, bottom surface of the substrate. FIG. 2 illustrates the substrate 10 after completion of several of operations according to this invention, later to be described. Thus, the numeral 16 denotes any one of a plurality of integral lenses, termed lensettes because of their small size, distributed in a generally regular array over the entire face of the completed microfiche element. The numeral 18 denotes opaque, inter-lensette portions also distributed over the entire face of the finished microfiche. The lensette elements 16 and opaque portions 18 cooperate with information sets on the lower side of the substrate in a manner known in this art and accordingly further description need not be given. The numeral 15 denotes any one of a plurality of indentations in surface 14 in the form of hemispherical dimples. The dimples are generally of varying depth and diameter and lie in regions below the lensettes. The spacing between them is uniform. Their variation of size defines the final, projected image. The dimples, or their absence, thus define information sets.

Figure 3:
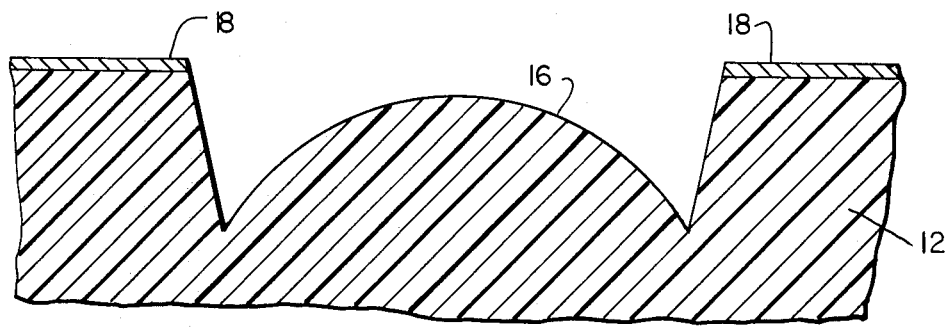
FIG. 3 is an enlarged view of the region within zone 3 of FIG. 2.

FIG. 3 illustrates a typical set of dimples 15 beneath a single lensette 16. Three are illustrated. Three typical dimples are denoted by the numerals 15a, 15b, and 15c and vary, generally, in depth and diameter. Their spacing relative to each other and relative to their associated lensette 16 is uniform because of the way in which they are formed. The arrowed lines represent incoming projection light from beneath the lensfiche and their refraction by the dimple surfaces. It is seen that by virtue of the refraction, only an insignificant portion of the projection light entering any given dimple is transmitted vertically upwardly through the lensfiche to the viewing screen. Hence, a dimple will yield a corresponding darker area on the viewing screen, while the undimpled areas on surface 14 will yield corresponding lighter areas on the viewing screen.

Figure 4:
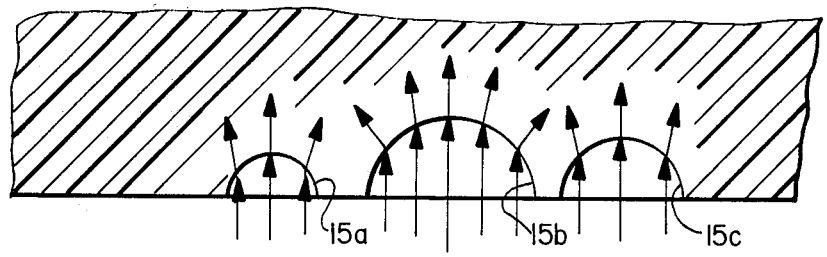
FIG. 4 is a greatly magnified partial cross-sectional view of the relief surface of a photoresist formed stamping block after being processed.

FIG. 4 of the drawings illustrates, in greatly magnified form, a finished relief stamping surface of a photoresist stamping block. The relief surface is defined by upstanding nodules 34 generally hemispherical in form. They are distributed throughout the entire top area of a photoresist block. A typical material from which the embossing or stamping photoresist block 30 is formed is nickel because of its high strength.

Figure 5:
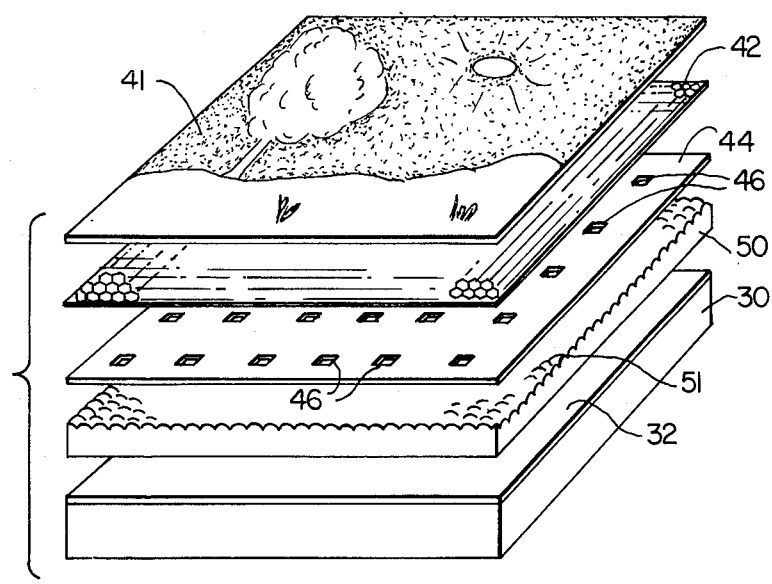
FIG. 5 is a partially schematic view illustrating a method of making a master relief or photoresist block employed for making copies.

FIG. 5 illustrates one method of making a stamper or embossing element such as 30 of FIG. 4. The numeral 41 denotes a negative master transparency of a scene which is to be optically recorded. It is the negative of a transparency such as 40 of my noted copending application filed June 3, 1975. Thus, where a so called positive transparency would be light at zones corresponding to the sky in an outdoor scene, such zones are dark on the negative master transparency 41 of this invention. The scene on the transparency is here illustrated as an outdoor scene consisting of a tree, the sun, the sky and a few small hills, it will be understood, however, that any type of recording may be placed on the master negative transparency 41 and it will be further observed that the method of making such master transparencies is known and is outside of the scope of this invention. The numeral 42 denotes a screen consisting of accurately spaced lines of the type well known in the photographic and printing arts. The lines cross each other to define generally hexagonal openings. Typically, its lines are spaced 100 lines per inch. The screen is placed, as illustrated, beneath the negative transparency 41. The numeral 44 denotes an opaque plate or mask having regularly spaced apertures 46 over its surface, the mask 44 being termed a selector mask. The numeral 50 denotes a lensfiche element of the type described in my above-noted patents, except that it does not have any photographic emulsion or any other coating on its lower surface. The lens elements or lensettes 51 on its top surface may be of a size shown in my above-noted patents and (typically) serve to reduce or to magnify by a factor of 25. Lensfiche 50, selector mask 44, screen 42 and master transparency 41 are all parallel and in practice are sandwiched together on top of the photoresist block 30. Now, the first macro scene is to be recorded. To do this, the transparency 41 is illuminated from above, the light passing down through screen 42, a portion passing through selector mask openings 46, that portion in turn passing through the lensettes 51 (a single lensette being associated in optical alignment with a single and corresponding mask opening 46) and finally passing onto photoresist surface 32. This completes the photographic exposure for the first transparency 41 corresponding to a first macro scene. Next, the photoresist block 30 is indexed so as to expose fresh or virgin photoresist material directly underneath the mask openings 46. Also, a second master transparency 41 having a second macro scene thereon is placed on top of screen 42. The illumination process is repeated. For the third taking, the block 30 is again indexed to reveal fresh or virgin photoresist material directly underneath an optical alignment with the mask openings 46 and a third master negative transparency 41 having a third scene thereon placed on top of screen 42. It is of course understood that each master transparency 41 is removed after the illumination process, so that only one master negative transparency at a time is on top of the sandwiched assembly.

The reader will now be in a position to comprehend the role of screen 42. The screen causes nodules 34 to be formed at all areas of the stamping block 30 which correspond to dark areas of the real scene. On those macro (real) scenes of which there were large bright areas (such as large areas corresponding to a sky) no nodules are formed. Note that in bright areas of the real macro scene, the screen 42 plays no role.

The size and distribution of the nodules over the relief surface of the stamping block 30 is determined in the following manner. Consider first a case wherein there are no dark areas whatsoever (reverse) transparency 41. Now, light is directed from above onto the clear transparency and onto screen 42, through mask openings 46, through the lens plate 50 and onto photoresist 32. While there is a uniform intensity of light from the source, the light falling on photoresist 32 will be discontinuous because of the dark lines of the grid. After development of the photoresist by, for example, the etching process, (although it makes no difference whether it or electroforming is used) the height and thickness of each nodule and the internodule distance will be the same.

Consider now a case wherein there are variably dispersed dark and light areas on the master transparency 41, such as would be the case in practice. Again, the illumination and nodule producing process is repeated. At the conclusion of the (electroforming or etching) process, those areas on the top surface of stamping block 30 which received a maximum amount of light generate nodules of the greatest cross-sectional area. The areas on the photoresist surface directly beneath darker areas on the master transparency generate nodules of lesser thickness. No matter what the intensity of the light, however, the internodule distance will be the same. Of course, where no light whatsover is incident upon the photoresist surface 32, there will be no nodule formation at those regions.

As a typical example, and following the parameters set forth in my earlier noted patents, a process would embrace the recording on the photoresist material 32 of 625 master transparencies 41. The stamper block 30 is now ready for processing by either etching (taking metal away) of electroforming (adding metal). The etching is such that larger nodules 34 are formed where the light intensity was the least and smaller nodules are formed where the light intensity is the greatest. Etching and electroforming are well known in the art, such as in the art of micro-electronic circuitry module formations, and hence need not here be described. With the stamper block 30 now having the relief surface on its top defined by a plurality of upstanding nodules 34, the next stage for making or mass producing copies is set. The noduled surface of block 30 is pressed onto plain surface 14 of a blank. A cavity 15 is thus formed on the surface 14 at the immediate region of each nodule. The block is now withdrawn from the surface and, except for the formation of the lensettes 16 and opaque portions 18, the microfiche is complete. It will be observed, as noted earlier, that the dimples 15 on surface 14 define a plurality of information sets which completely correspond to the microimages in the photographic emulsion of microfiche elements made in accordance with my above-noted patents. However, the need for photographic emulsion with the attendant silver bromide and photographic technology is not required by the practice of this invention. All that is required is the stamping block having the nodules 34 which correspond to the information sets, which in turn correspond to the macro images, and surface 14 which is indented by these nodules. The earlier described refraction of projection light from below the lensfiche copy (FIG. 3) employed in the viewing on a projection screen is of course due to the change of the index of refraction experienced by the light in passing from air to the plastic lensfiche body. Opaque portions 18 as well as the opaque septa employed on such viewers, known in this art, function to inhibit cross-talk.

The degree of contrast to be found in the duplicates depends on the position and nature of the screen 42. It the screen is directly up against the intelligence of master 41, it is preferable, as is well known to those versed in the art of commercial printing, to use a so-called vignetted dot contact screen. On the other hand, if the screen 42 is positioned somewhere between 41 and 44, then a cross-line half-tone screen is to be used. The amount of contrast desired depends upon the position of this screen.

Assume the number of fine lines per inch on screen 42 to be N. If the reduction ration is $1/m$ where $m$ is the magnification upon final viewing, then the number of lines per inch of the photoresist would be $m \times N$. Typically N is 100 lines per inch and $M = 25$, therefore, recordation is made of 2500 per inch on the photoresist surface 32, the interline spacing is 1/2500 of an inch or 0.4 mils or 10 microns. There are, at present, commercially available photoresists, for example, Kodak Thin Film Resist, which can accommodate, so to speak, 1 micron resolution. This is more than ample for the practice of this invention. Hence, in this specific example, the bit area, being the area between the nodules 34, is 10 microns × 10 microns, or 100 sq. microns. Therefore, for a 4 mil × 4 mil image from 1 lensette corresponding to an area 100 microns × 100 microns for $m = 25$ on the master transparency 41, there can be a total of 100 bits of information stored. If, on the other hand, a screen 42 of 200 lines per inch is employed, then 400 bits of information can be stored. The greatest resolution the human eye can accommodate in a 100 mil × 100 mil area is around 225 bits at the normal reading distance. Accordingly, there is no requirement for 200 lines per inch or greater at a magnification of 25 for the screen 42.

Referring now to FIG. 6 of the drawing, another method of forming a master photoresist indenting block having a relief surface is illustrated. Here, it is assumed that a microfiche 60 having integral lensettes 61 on its top surface and photographic emulsion 62 on its bottom surface, the emulsion already carrying developed or fixed micro images is available. Microfiche 60 is a negative of the usual (positive) microfiche, i.e., dark areas of an original appear light upon readout, etc. Such a microfiche may be obtained by techniques shown in my noted-above patents and as known in the photographic arts. Again, virgin photoresist block 30 having photoresist emulsion 32 is employed. Between negative microfiche 60 and photoresist block 30 is located a very finely divided screen 43 having hexagonal openings positioned directly on the photoresist surface: the screen 43 has 2500 lines per inch, for example. The elements are placed in positions as illustrated at FIG. 6. The entire top of microfiche 60 is now illuminated. This results in an optical transformation of the information on developed emulsion 62 to the photographically sensitive surface 32. The block 32 is now taken and subjected to known etching or electroforming process for producing a relief surface having nodules 34 which, again, entirely correspond to the micro information sets on the original emulsion film 62. The completed block 30 is now utilized as previously described to make copies of microfiche elements.

Figure 1:
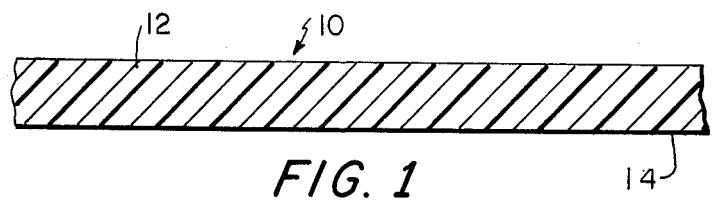
FIG. 1 is a typical partial cross-secton view illustrating a blank employed for the construction of microfiche copies.

Referring now to FIG. 7 of the drawings, another embodiment for making microfiche copies on a mass production basis is illustrated. Here, a photoresist block 30 having nodules 34 formed in accordance with any of the above processes is employed. A virgin or raw microfiche blank 10 of the type illustrated at FIG. 1 is positioned as illustrated at FIG. 7, with embossing die 52 having a lower surface 54 which will produce, upon stamping or embossing, a surface such as the top surface of a completed microfiche element shown at FIG. 2. The two elements 52 and 30 now squeeze, in a sandwich manner, the virgin blank 10 to form the final product. Thereafter, the inter-lensette surfaces may be suitably coated. If desired, the lower surface of the now completed copy 10 may be provided with a protective film such as silicon oxide.

The above description has been directed to a process for duplicating, in an inexpensive manner, lensfiche elements. The invention, however, is not restricted to the duplication of such elements. For example, the invention may be employed to duplicate motion picture film. The reader is in a position to comprehend that duplication of motion picture film entails the same basic steps, with the photoresist block 30 assuming the form of a continuous and preferably flexible metal strip. The top surface of this metal strip would be provided with a photoresist coating 32, the original motion picture film would correspond to master transparency 40 and a grid 42 (in the form of a continuous strip) again would be employed. At the conclusion of the formation of the master punching block (now in the form of a continuous, elongated flexible metal strip) the block would be employed to continuously indent one surface of transparent film. After such indenting, the film would be projected in the conventional manner. This latter strip with the idented portions defines the motion picture film copy. Clearly, economy is realized by the practice of this invention as applied to the duplication of motion picture film in that the expense of silver bromide emulsions is now present, and further, the technology of photographic film processing is not required.

The invention has been described with reference to a metal photoresist block. It will be apparent however that the specific material from which the punch block 30 is formed, as well as the specific manner of forming the nodules 34, do not limit the invention. However, other methods may be employed to fashion the stamper. For example, thermoplastic material could be employed from which to fabricate the punch block. (see Kazan & Knoll, "Electronic and Image Storage", Academic Press (1964), page 442). A screen 42 (FIG. 5) or 43 (FIG. 6) having a uniformly spaced grid will, using the described metal photoresist block, yield nodules being uniformly spaced from each other. However, the invention is not limited to such nodules of hemi-spherical configuration and to grids 42 of uniform spacing. For some applications the grid spacing may be non-uniform over the screen, and the nodule variation may be limited to variations in nodule height. The central theme of the invention is the replication of distributed information sets by indenting, such that upon projection of light through the microfiche copy there exists a faithful reproduction of the original macro scenes, by way of faithful reproduction of the original macro scenes, by way of faithful reproduction of their corresponding micro images. The master negative transparency which is to be duplicated and then inexpensively massproduced may be in the convention form such as that denoted by the numeral 41 of FIG. 5, or it may be an already-formed microfiche carrying micro images such as that denoted by the numeral 60 of FIG. 6.

The stamper nodules 34 have been illustrated as spherical in form. They may, however, also be ellipsoidal, parabolic, or conical. In the latter case, the cone angle can be so selected that the incident parallel light is totally refracted away from the lensettes 16. The calculation for such cone angles is well known to those in the optic arts.

What is claimed is:
1. A method of making microfiche elements including the steps of,
   a. forming a microfiche blank of a generally transparent sheet,
   b. forming a block having a relief surface defined by nodules, the nodule distribution corresponding to a plurality of information sets, each information set corresponding to a unique macro scene, each information set occupying dispersed areas interlaced with but distinct from the dispersed areas occupied by any other informaion set,
   c. pressing said relief surface onto one surface of said sheet to selectively indent portions thereof and thus form dimples in the sheet corresponding to the raised portions of said relief surface, d. forming the other surface of said generally transparent sheet so that it has a plurality of integral lenses, the lenses being related to the dimples such that each sub-set of dimples which corresponds to each macro scene is in optical alignment with a unique sub-set of integral lenses, e. whereby the dimpled portions of the transparent sheet correspond to a plurality of macro scenes.

2. The method of claim 1 wherein said block is a photoresist block.

3. The method of claim 1 wherein said integral lenses are formed by embossing.

* * * * *